United States Patent
De Vries et al.

(10) Patent No.: US 7,288,204 B2
(45) Date of Patent: Oct. 30, 2007

(54) METHOD AND ARRANGEMENT FOR TREATING A SUBSTRATE WITH AN ATMOSPHERIC PRESSURE GLOW PLASMA (APG)

(75) Inventors: Hindrik Willem De Vries, Tilburg (NL); Fuyuhiko Mori, Tilburg (NL); Eugen Aldea, Tilburg (NL); Mauritius Cornelius Maria Van De Sanden, Tilburg (NL)

(73) Assignee: Fuji Photo Film B.V., Tilburg (NL)

( * ) Notice: Subject to any disclaimer, the term of this patent is extended or adjusted under 35 U.S.C. 154(b) by 155 days.

(21) Appl. No.: 10/198,740

(22) Filed: Jul. 19, 2002

(65) Prior Publication Data

US 2004/0011764 A1 Jan. 22, 2004

(51) Int. Cl.
*B44C 1/22* (2006.01)
*H01L 21/00* (2006.01)

(52) U.S. Cl. ............................ 216/67; 216/58; 216/59; 438/706; 438/710; 315/111.21; 427/38; 427/569

(58) Field of Classification Search ................. 216/67; 427/38, 569; 315/111.21; 438/706, 710
See application file for complete search history.

(56) References Cited

U.S. PATENT DOCUMENTS

| | | | | |
|---|---|---|---|---|
| 4,396,865 | A | * | 8/1983 | Britt et al. .................... 315/36 |
| 5,124,173 | A | * | 6/1992 | Uchiyama et al. .......... 427/569 |
| 5,733,610 | A | * | 3/1998 | Okazaki et al. ............. 427/569 |
| 5,982,095 | A | * | 11/1999 | Jin et al. ..................... 313/582 |
| 6,147,452 | A | * | 11/2000 | Kunhardt et al. ........... 313/582 |
| 6,299,948 | B1 | * | 10/2001 | Gherardi et al. ............ 427/569 |
| 6,411,033 | B1 | * | 6/2002 | Mori et al. .................. 313/582 |
| 6,635,996 | B1 | * | 10/2003 | Nakajima et al. ....... 315/111.21 |

\* cited by examiner

*Primary Examiner*—Shamim Ahmed
(74) *Attorney, Agent, or Firm*—Davidson Berquist Jackson & Gowdey LLP

(57) ABSTRACT

Method for generating an atmospheric pressure glow plasma (APG), wherein said plasma is generated in a discharge space between a plurality of electrodes. A dielectric is present on at least one of said electrodes, said dielectric having a boundary surface with said plasma enabling interactions between said plasma and said surface. Said dielectric is arranged for releasing electrons contributing to said plasma from said surface by said interactions.

46 Claims, 4 Drawing Sheets

METHOD AND ARRANGEMENT FOR TREATING A SUBSTRATE WITH AN ATMOSPHERIC PRESSURE GLOW PLASMA (APG)

FIELD OF THE INVENTION

The present invention relates generally to a method for generating an atmospheric pressure glow plasma (APG), and in particular to a method wherein said plasma is generated in a discharge space between a plurality of electrodes, and wherein a dielectric is present on at least one of said electrodes, said dielectric having a boundary surface with said plasma enabling interactions between said plasma and said surface, wherein said dielectric is arranged for releasing electrons contributing to said plasma from said surface by said interactions.

The present invention further relates to arrangement for generating an atmospheric pressure glow plasma (APG), comprising a discharge space substantially located between a plurality of electrodes for generating a plasma, at least one of said electrodes comprising a dielectric attached such that a boundary surface between said dielectric and said discharge space is arranged for enabling interactions between said plasma and said surface, wherein said dielectric is arranged for releasing electrons contributing to said plasma from said surface by said interactions.

BACKGROUND OF THE INVENTION

Modification or treatment of a surface by applying glow plasma is a known technique in industries, such as photo film production industry, used in order to improve certain surface and material properties. For instance, in the production of photo film, a thermoplastic polymer film (polyethyleneterephthalate or polyethylene-naphthalate, or similar) is prepared using a glow plasma in order to improve adhesion properties of the surface.

Plasma is considered generally as a suitable solution for material processing, because it generates a large flux of reactive species (radicals, ions), which can be directed to the process zone and manipulated to the desired shape by using an appropriate electric field distribution. Plasma treatment would have considerable advantage if it could be generated at atmospheric pressure, and in the presence of air. Advantages of using atmospheric pressure are a larger density of reactive species than in the low pressure case, and the advantage of avoiding vacuum technology. The advantages of using air instead of other gasses is the fact that it is cheap and readily available.

Another desired feature of atmospheric pressure glow plasmas (APG) is the generation of these plasmas at low temperatures around 300-400 K. This will make the technology applicable to the treatment of thermoplastic polymer surfaces, as is common in photo film production methods.

Generating a plasma under the above circumstances is not a straight forward technique. At atmospheric pressure, the particle density is high and as a result the mean free path of reactive species is small. The processes of excitation and ionisation are restricted to a limited area, and the plasma is generated primary in a filamentary form.

Plasmas at atmospheric pressures are very unstable and will tend to go into a spark or an arc in short time after the breakdown. Any random local increase in a current density will tend to grow rather than to be damped and plasma will be constricted.

Transition to spark or arc can be prevented by limiting the current density and the plasma duration, by using high gas flows. The simplest solution to limit the current density and plasma duration is to cover the electrodes with a dielectric (dielectric barrier discharge configuration, DBD). As a result of this, the charges are accumulated on the surface of the dielectric, reducing the value of the voltage applied to the plasma. When the magnitude of the voltage applied to the plasma decreases below a critical level (the cut-off voltage), the plasma can not be sustained any longer. As a result, the duration of the plasma is limited.

A problem of dielectric barrier discharge is that by covering electrodes with a dielectric, high voltages for plasma ignition (2-10 kV) are required. The use of these high voltages is required to increase the ionisation degree, since a major source of electrons, the electron emission from the metal electrodes via ion bombardment or photo ionisation processes, is lost. As a result, most of the dielectric barrier plasmas are generated through a mechanism known as streamer formation. Streamers are short life, high electron density, filamentary plasmas. Due to non-uniformity of these plasmas and material damage as a result of the intense ion bombardment, application of this technique in material processing methods creates problems. Electronic means for suppressing streamer formation and generation of a uniform glow plasma are not available, and thus alternatives have been investigated.

SUMMARY OF THE INVENTION

It is an object of the invention to provide a method for generating an atmospheric pressure glow plasma with a uniform electric discharge preferably at temperatures around room temperature.

In a first aspect according to the present invention, there is provided a method for generating an atmospheric pressure glow plasma (APG), wherein said plasma is generated in a discharge space between a plurality of electrodes, and wherein a dielectric is present on at least one of said electrodes, said dielectric having a boundary surface with said plasma enabling interactions between said plasma and said surface, wherein said dielectric is arranged for releasing electrons contributing to said plasma from said surface by said interactions.

It has been observed that by providing a boundary surface between the plasma and the dielectric and arranging said dielectric such that electrons are released by interactions between the surface and the plasma, the stability and uniformity of the plasma are greatly enhanced.

Generating a plasma requires the supply of sufficient energy to a gas such that the gas is ionised. Within the plasma, collisions and interactions between elements of the gas create chemically or physically active species, such as metastables, ions, electrons, and others. Recombinations and transitions of excited elements to their ground state also causes the emission of photons from the plasma.

For the plasma to sustain, sufficient free electrons should be present in the plasma. For obtaining a homogenous atmospheric plasma a solution is the generation of a background pre-ionization, implying that sufficient seed electrons must be present in the reactor before the plasma breakdown. These seed electrons can be created as described above, through interactions within the plasma itself or can be generated as a result of a interaction between or the species present in the plasma and the boundary surface between the plasma and the dielectric. It is observed that under the right conditions the required background pre-ionization can be generated at the surface level. These electrons contribute to the plasma, such that under said right conditions a homogeneous uniform atmospheric glow discharge plasma having temperatures around room temperature is created.

Another solution for obtaining a homogenous atmospheric glow plasma is to generate at the surface in contact with the plasma a large number of secondary electrons allowing than that as a result of a single primary electron avalanche, secondary avalanches will be generated in all the volume of the reactor. It is observed that under the right conditions a homogenous plasma can be generated in this way.

In order to achieve this, the dielectric used for generating said APG may have surface regions comprising a low work function.

The work function is here defined as the energy required to knock out an electron from the surface of the dielectric such that it has just enough energy to overcome the potential barrier and end up out of surface without having kinetic energy. A dielectric surface comprising regions where the work function is low or at least comparable to the energy that can be transferred by species present in the plasma, may release sufficient numbers of electrons to sustain a stable homogeneous uniform APG.

The dielectric that is used may be arranged to optimise the creation of free electrons though any of the following mechanisms, for which a number of physical and chemical properties of the dielectric material used are important.

EMBODIMENT A

In an embodiment of the present invention the dielectric material together with the applied electric field, the interelectrodic gap, the current density, the plasma frequency and the dielectric thickness, are arranged in such a way for giving the electrons the energy which is sufficient to overcome the potential barrier at the surface level and said discharge space under the influence of the applied electric field and of the electric field generated by the electrons formed in plasma and located at the dielectric surface boundary.

| Required material/plasma properties | |
| --- | --- |
| Applied Electric field: | 10-100 kV/cm |
| Inter-electrodic gap: | 0.1-10 mm |
| Current density: | 0.1-10 mA/cm$^2$ |
| Charge per unit of surface: | >1-100 nC/cm$^2$ |
| Dielectric thickness: | 10-1500 µm |
| Pulse frequency: | 1 kHz-1 MHz |

At least 10 ppm of the surface area must have a work function lower than 0.2 eV. In the low work function regions of the surface the applied electric field must be locally intensified by the combination of the electric charge located at the surface boundary and the surface roughness to values of at least 100 kV/cm. The background pre-ionization generated by the electrons emitted by the surface through field emission must have a value of at least 1 nA/cm$^2$.

EMBODIMENT B

In another embodiment of the present invention the dielectric in contact with the plasma is arranged for enabling thermo-electronic emissions of electrons at operating temperature. The background pre-ionization generated by the electrons emitted by the surface through thermo-electronic emission must have a value of at least 1 nA/cm$^2$. The temperature will be 20-80° C.

EMBODIMENT C

In another embodiment of the present invention the dielectric used together with the applied electric field, AC pulse repetition frequency, and the interelectrodic gap and are arranged for releasing electrons from said surface under influence of interaction which interactions comprise interactions between photons from said plasma and electrons located at the surface level.

| Required material/plasma properties The probability of secondary photo-ionisation (Townsend γ coefficient) must be higher than 0.1 | |
| --- | --- |
| Applied Electric field: | 10-100 kV/cm |
| Inter-electrode gap: | 0.1-10 mm |
| current density: | 0.1-10 mA/cm$^2$ |
| Charge per unit of surface: | >1 nC/cm$^2$ |
| Pulse frequency: | 1 kHz-1 MHz |

EMBODIMENT D

In another embodiment of the present invention the applied power, the pulse frequency and the dielectric used are arranged for releasing the electrons from said surface under influence of interaction which interactions comprise collisions between metastables species and electrons formed in plasma and the dielectric molecules at the surface level. By such interaction excited molecular states of low work function are formed at the surface level. This states are able to release electrons by increasing the probability of secondary photo-ionisation.

Required Material/Plasma Properties

Material/Plasma Properties

The lifetime of the excited molecular states must be at much higher than the pulse repetition period. The AC voltage frequency must be than in the range of 1 kHz-1 MHz. Due to the presence of these excited molecular states the probability of secondary ionisation (Townsend γ coefficient) must increase above 0.1.

Current density: 0.1-10 mA/cm$^2$

It has further been observed that by using dielectric materials such as polyesters, fluoro polymers, ceramics or combinations of these in said dielectric, the stability and properties of the plasma improve. It is in particular suggested to use polyethyleneterephthalate (PET), polyethylenenaphtalate (PEN), polytetrafluoroethylene (PTFE), triacetylcellulose (TAC), polyethylene (PE), ceramic such as silica or alumina, or combinations of these.

In another embodiment of the present invention, the dielectric material is selected from the materials which intensifies the applied electric field at the surface of said dielectric in such away that sufficient energy is provided to the electrons on the surface to overcome the potential barrier.

Examples of suitable dielectric material is microporous polymers such as polyvinylidene fluoride, feroelectric polymer films, micro porous polyethylene, micro porous polypropylene, micro porous PEN, Methylcellulose membrane, cellulose acetate membranes, polytetra-fluoroethylene membranes, Polyvinyl chloride membranes, polyimides membranes, etc., and micro porous ceramics material.

| Required material/plasma properties | |
| --- | --- |
| Applied Electric field | 10-100 kV/cm |
| Interelectrodic gap | 0.1-10 mm |
| Current density | 0.1-10 mA/cm$^2$ |
| Charge per unit of surface | >1-100 nC/cm$^2$ |
| Dielectric thickness | 100-1500 micrometer |
| Pore size | 0.1-100 microns |
| Pulse frequency: | 1 kHz-1 MHz |

At least 10 ppm of the surface area must have a work function lower than 0.3 eV In the low work function regions of the surface the applied electric field must be locally intensified by the combination of the electric charge located at the surface boundary and the surface micro porosity to values of at least 100 kV/cm.

As explained above, APG's are often used to treat substrates. In many cases these substrates will be of dielectric material as well, for example treatment of polymer film surfaces.

It is thus within the spirit of this invention to apply the APG for various application such as in the surface activation processes which substrate can be glass, polymer, metal, etc. For the generation of hydrophobic or hydrophilic surfaces; in the chemical vapour deposition process where specific chemical compositions gasses such as $SiH_4$, hydrocarbons, organosilicons (TEOS, HMDSO, etc.) or organo-metallics are usually involved; in the chemical decomposition of gases containing volatile ozone component (VOC), in the removal of toxic compounds from the gas phase, in the increase of combustion degree of hydrocarbons, in the surface cleaning processes the of various substrate where sterilisation or dry cleaning purposes can be realised, in deposition processes of polymers and in deposition processes for oxidic materials.

In an embodiment of the invention, wherein said plasma is used for treating a substrate and the material used as a dielectric and said substrate are of a same or comparable chemical family. Both dielectric and substrate may even be of a same material, in the case of APG treatment for photo film production this material may be PEN.

One may even use, with respect to what is suggested above, another substrate sample to be treated for use as a dielectric. In this last case two substrate samples can be treated with an APG simultaneously.

In another embodiment of the invention, a gas is present in the discharge space and said gas comprises any element of a group comprising argon, nitrogen, oxygen, carbon dioxide, air, helium, $NH_3$ and combinations thereof. Also other gasses comprising specific chemical composition such as $SiH_4$, hydrocarbons, organo-silicons (TEOS, HMDSO) which is usually involved in the chemical vapour deposition process, may be present in said discharge space.

It is observed that the plasma properties improve in the presence of these gasses. The effect can be enhanced by establishing a (continuous) gas flow through the discharge space.

It has been observed that a method provided by the invention can be used under the circumstances (with reference to the operation parameters) presented in the table below:

| Parameter | Description | Range | Optimum |
| --- | --- | --- | --- |
| U | AC voltage amplitude | 1-20 kV | 10% higher than breakdown voltage |
| f | AC voltage frequency | 1 kHz-1 MHz | 10-500 kHz |
| $D_{gap}$ | Gap distance between substrate and dielectric | 10-3000 μm | 250-1500 μm |
| $\Phi_{vol, gas}$ | Volumetric gas flux of gas flow | 1-50 l/min | 10 l/min |
| $d_\epsilon$ | Thickness of the dielectric | 1-1000 μm | 250-500 μm |

The dielectric may be comprised of any of the following substances: PEN, PET, fluoro polymers (such as PTFE), amino-polymers (such as polyamide) ceramics (such as alumina, silica). Materials with containing electronegative species are also a preferred option.

It will be appreciated by those skilled in the art, that by moving the substrate, which may be a thermoplastic polymer film, through the discharge space past the plasma, this will have a positive effect on the efficiency of surface treatment. In case a second substrate film is used instead of a dielectric, as suggested above, both substrates may be moved through the discharge space, and will be treated simultaneuosly.

In a second aspect, the invention provides an arrangement for generating an atmospheric pressure glow plasma (APG), comprising a discharge space substantially located between a plurality of electrodes for generating a plasma, at least one of said electrodes comprising a dielectric attached such that a boundary surface between said dielectric and said discharge space is arranged for enabling interactions between said plasma and said surface, wherein said dielectric is arranged for releasing electrons contributing to said plasma from said surface by said interactions.

The present invention will now be further elucidated by a description and drawings referring to a preferred embodiment thereof, directed to the treatment of a substrate surface with an APG, in particular for use in photo film production industry. The invention is not limited to the embodiments disclosed, which are provided for explanatory purposes.

Figure 1:
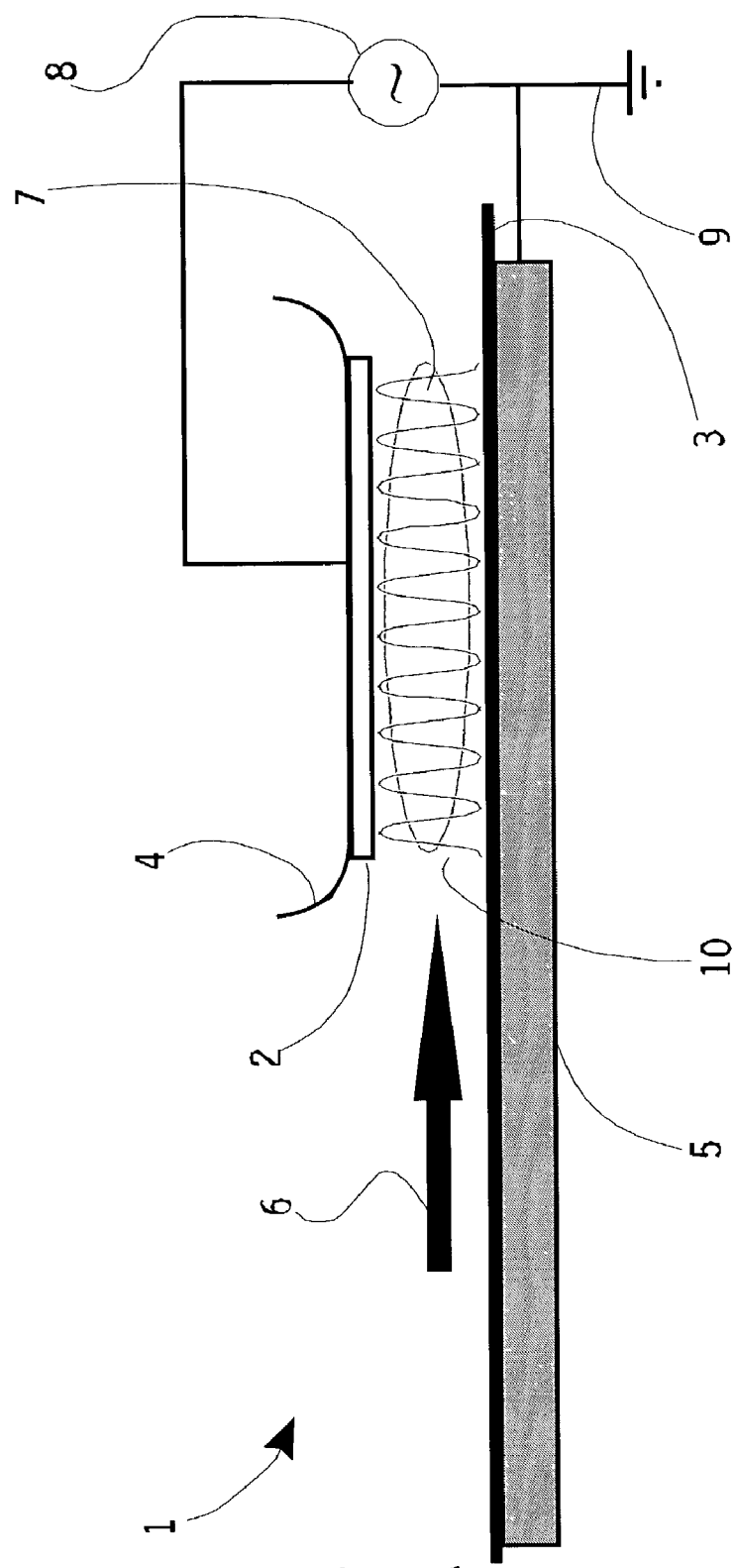
FIG. 1 is a schematic drawing of an arrangement for carrying out a method according to the present invention.

DETAILED DESCRIPTION OF THE DRAWINGS in FIG. 1 an arrangement for generating plasma 1 comprises a dielectric 2 connected to a first electrode 4. A second electrode 5, arranged for carrying a substrate film 3, is arranged on the opposite side of a discharge space 10. A gas flow 6 may be established parallel to the surfaces of said dielectric 2 and substrate film 3. First electrode 4 has been connected to an AC power supply 8, arranged for providing an AC voltage. Second electrode 5 has been connected to said AC power supply 8 as well as to ground 9.

In a method according to the present invention, a gas flow 6 may be established comprising one or more gasses such as argon, nitrogen, oxygen, carbon dioxide, Helium and $NH_3$ or any combination or mixture of these gasses. Surprisingly, it has been observed that with a method according to the present invention, the presence of substantial amounts of oxygen does not influence the plasma stability negatively.

After establishing a gas flow, the electrodes (4, 5) are energised by AC power supply 8. Power supply 8 will provide an AC voltage with an amplitude in the range of 3-6 kV (optimal 5 kV), at frequency in the range of 1 kHz-1 MHz (optimum 10-500 kHz). Upon reaching a break down voltage, which is dependent on, amongst others, the gas used and the properties of the dielectric 2, a plasma 7 will be generated between the dielectric 2 and the substrate film 3. Simultaneously, the substrate film 3 may be moved in any direction past the plasma in order to treat said film 3 along its full surface.

The dielectric 2 may comprise a material such as PET, PEN, PTFE or an ceramic such as silica or alumina. Any combination or mixture may be used as well. In photo film production industry, the substrate film 3 may be a bearer film for a photo sensitive substance, which is treated with an APG plasma first, in order to improve its adhesion properties before adding said photo sensitive substance. Said bearer film may be any suitable polymer, but often materials such as PEN, PET, TAC, PE, or Polyolefin laminated paper will be used for this purpose.

The distance between the dielectric 2 and the substrate film 3, forming the discharge space 10, may be in the range of 0.1-5 mm, with an optimum distance of 250-1500 µm. The volumetric gas flux of gas flow 6 may be within the range of 1 l/min and 50 l/min, with an optimum around 10 l/min. The thickness of dielectric 2 may be in a range of 1-1000 µm, with an optimum between 250 µm and 500 µm.

It has been observed that under the circumstances described above a stable plasma can be generated. The stability of the plasma is affected by the surface of the dielectric. It has been shown that some organic dielectrics, such as PEN or PET, provide a better plasma stability in comparison to other dielectrics used. A scientific explanation of this is not yet available. Very good results have been achieved in experiments where the dielectric 2 was chosen to be PEN, as well as the substrate film 3. Based upon this result, one may replace dielectric 2 by a second substrate film, with the additional benefit that two substrate films can be treated at the same time.

Figure 2:
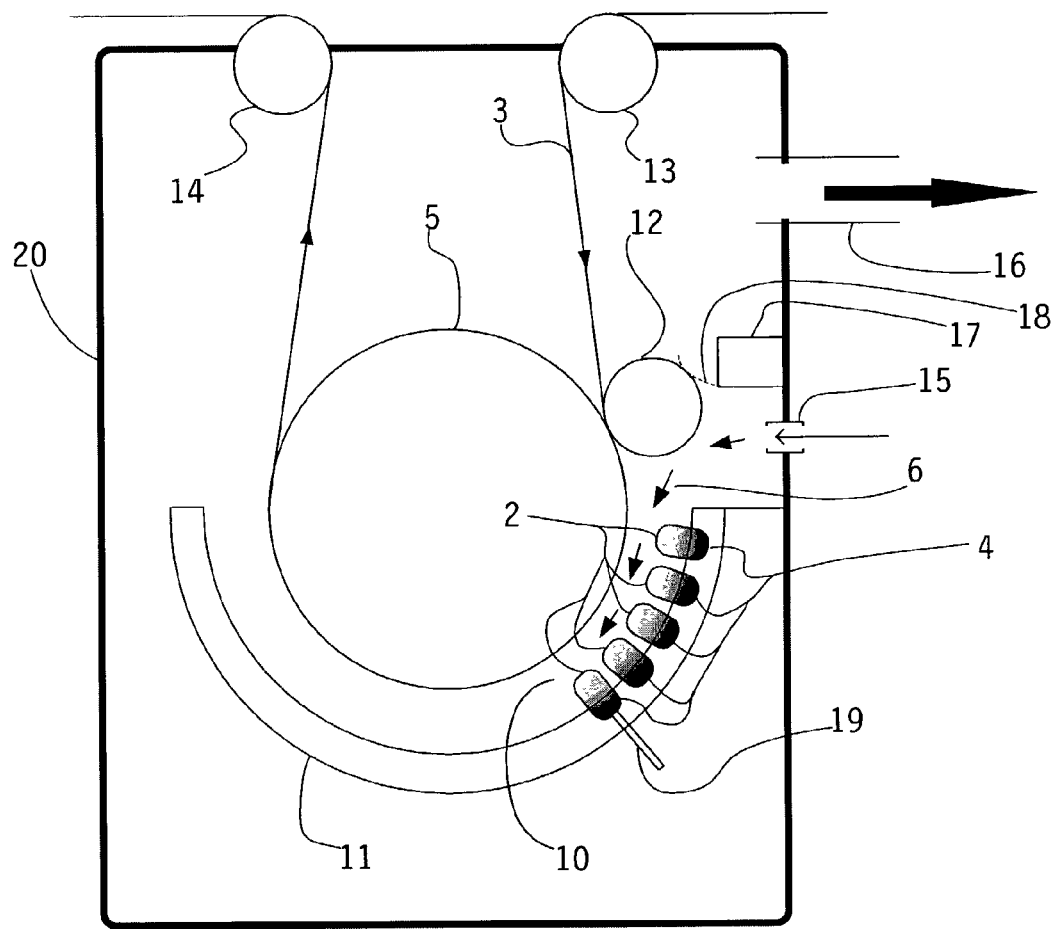
FIG. 2 is a drawing of an APG treatment device for treating substrate films.

FIG. 2 shows a device for treating a substrate film 3, such as a photo film. In this device, dielectric 2 has been coated on the surfaces of electrodes 4 forming the inside of a half circle around roll shaped electrode 5. Note that only a few electrodes 4 are shown in FIG. 2. Each electrode 4 is connected to a power supply (not shown) by connecting bar electrodes 19 at the back side of each electrode 4 to said power supply (note that only one bar electrode is shown). Electrodes 4 are attached to the device by electrode holder 11.

Via supporting roll 13 the substrate film 3 is brought inside treatment chamber 21 through the wall 20, and is lead past electrodes 4 via supporting roll 12 and roll shaped electrode 5. After treatment, substrate film 3 will leave the treatment chamber 21 via supporting roll 14 and an opening in the wall 20.

The discharge space 10, is formed by the gap between the dielectric 2 on the electrodes 4 and the substrate film 3 on roll shaped electrode 5. In use, a plasma will be generated between said dielectric 2 and said substrate film 3.

The APG treatment device, according to an embodiment of the present invention, further comprises a gas inlet 15 and a gas outlet 16 through which a gas can be blown into the treatment chamber 21 for establishing a gas flow 6 between dielectric 2 and substrate film 3. In order to prevent a direct gas flow between supporting roll 12 and wall 20 from the gas inlet 15 to the gas outlet 16, a wall 17 is attached to wall 20 and stretches out perpendicular to wall 20 in the direction of roll 12. The gap between the end of wall 17 and rotatable roll 12 is formed by a flexible wall 18, schematically drawn in FIG. 2. A gas flow 6 is as such forced to flow through discharge space 10.

Figure 3:
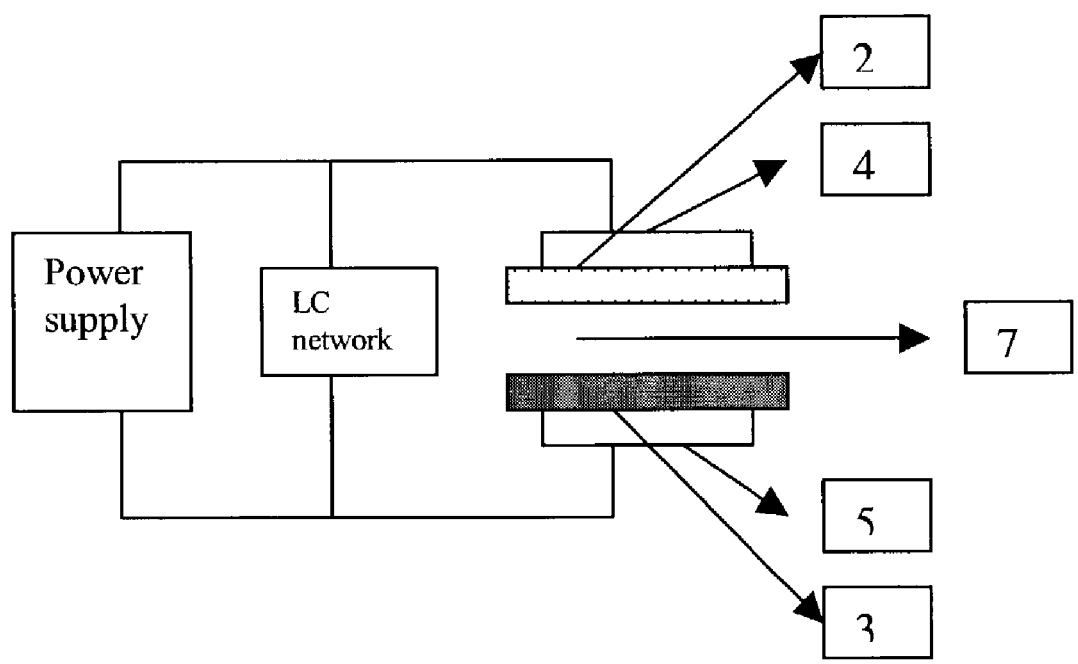
FIG. 3 shows an exemplary plasma forming set up.

In FIG. 3 the experimental set up is shown, as it has been used to analyse the effect of the plasma stability as function of dielectric material. The dielectric material 2, is a polyethylen-enaphtalate (PEN) film which is attached to the conductive material 4, and the dielectric material 3 is ceramic, which is coated on the conductive electrode 5. The distance between said dielectric 2 and dielectric 3 is 1 mm.

Nitrogen gas having a velocity of 2 m/sec. is fed into the discharge space 7. The electrode is charged with an AC power supply having a voltage of 2.8 $V_{pp}$ and frequency of 13 kHz in order to generate plasma. By using a oscilloscope, we can detect the I-V characteristic of the plasma which is represented in FIG. 4.

As it is known, plasma is generated only at the cathode and since the current is alternating, the effect of the plasma stability as function of the PEN or ceramic dielectric material can be easily evaluated.

Figure 4:
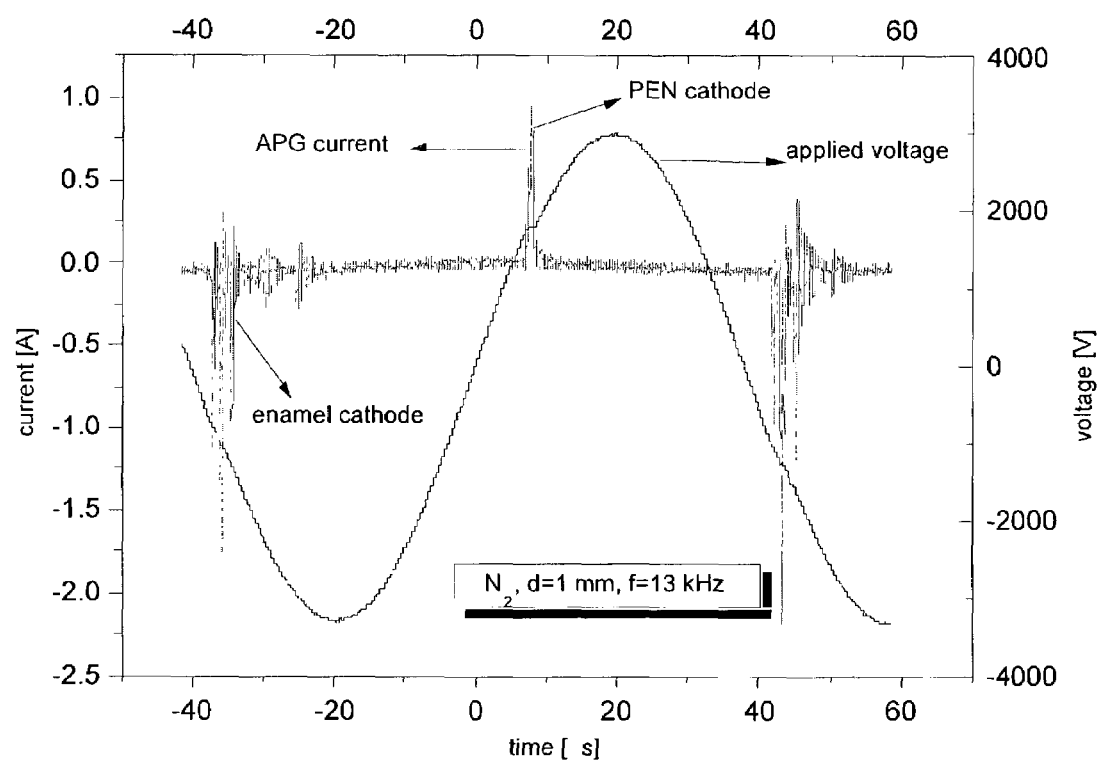
FIG. 4 shows plasma characteristics.

It can be seen in FIG. 4 that, for the above mentioned process condition, it is preferable to select PEN as a dielectric material, since it generates more stable plasma compare to ceramic. However, in case another process condition exists, where another gas is involved, a different result may be obtained. Hence a good selection of dielectric material and plasma process condition is always required.

For the purpose of comprehensiveness, it is noted here that numerous modifications and variations of the present invention are possible in the light of the above teachings. It is therefore understood that, within the scope of the amended claims, the invention may be practised otherwise than as specifically described herein.

The invention claimed is:

1. A method for generating an atmospheric pressure glow plasma (APG), wherein said plasma is generated by applying an AC voltage for establishing an electric field in a discharge space between at least a pair of electrodes opposing each other,
   wherein a dielectric, present on at least one of said electrodes has a boundary surface with said discharge space,
   wherein said boundary surface comprises at least one low work function region having a work function smaller than the energy transferred to said surface during interactions between said plasma and said surface,
   wherein at least one of a group of physical properties of said dielectric is adapted sufficiently to locally intensify the electric field within the at least one low work function region for releasing electrons contributing to said plasma from said surface by said interactions, and
   wherein said group of physical properties consists of:
   surface roughness of said boundary surface of said dielectric; and
   surface micro porosity of said boundary surface of said dielectric.

2. The method according to claim 1, wherein energy is transferred to said surface during said interactions, and wherein said at least one low work function region has a work function less than 0.3 eV.

3. The method according to claim 2, wherein said interactions comprise collisions between metastable species formed in said plasma and electrons bound to atoms at surface level.

4. The method according to claim 2, wherein said interactions comprise collisions between electrons from said plasma and electrons bound to atoms at surface level.

5. The method according to claim 2, wherein said interactions comprise interactions between photons from said plasma and electrons bound to atoms at surface level.

6. The method according to claim 2, wherein said interactions comprise collisions between ions present in said plasma and electrons bound to atoms at surface level.

7. The method according to any of the previous claims 2-6, wherein said surface comprises means reducing the work function of atoms at surface level.

8. The method according to claim 1, wherein said dielectric is arranged for enabling giving the electrons the energy which is sufficient to overcome the potential barrier at surface level and said discharge space, under the influence of an electric field present in said discharge space.

9. The method according to claim 1, wherein said dielectric is arranged for enabling thermionic emission of electrons from said surface, at operating temperature of said plasma.

10. The method according to claim 1, wherein said dielectric is selected from a group, consisting of polyesters, fluoro polymers, ceramics, and combinations thereof.

11. The method according to claim 10, wherein said dielectric is selected from a group consisting of polyethyleneterephthalate (PET), polyethylenenaphthalate (PEN), polytetrafluoroethylene (PTFE), ceramic such as silica or alumina, and combinations thereof.

12. The method according to claims 10 or 11, wherein said dielectric is selected from a group consisting of micro porous polymers such as polyvinylidene fluoride, feroelectric polymer films, micro porous polyethylene, micro porous polypropylene, micro porous PEN, Methylcellulose membrane, cellulose acetate membranes, polytetrafluoroethylene membranes, polyvinyl chloride membranes, polyimides membranes, etc., and micro porous ceramics material.

13. The method according to claim 1, wherein a gas is present in said discharge space, and wherein said gas comprises any element of a group consisting of argon, nitrogen, oxygen, carbon dioxide, air, helium and $NH_3$ and combinations thereof.

14. The method according to claim 1, wherein said plasma is used for treating a substrate, and wherein said substrate and said dielectric are of a same chemical family.

15. The method according to claim 14, wherein said dielectric and said substrate are of a same material.

16. The method according to any of the claims 14 and 15, wherein said dielectric is a further substrate which is treated with said plasma.

17. The method according to claim 1, wherein said dielectric has a thickness of at least 100 µm and at most 3000 µm.

18. The method according to claim 9, wherein the thickness of said dielectric is in the range of 250 µm-500 µm.

19. The method according to claim 1, wherein said discharge space has a dimension determined by a closest distance between said electrodes, wherein said dimension is in a range of 100 µm-5000 µm.

20. The method according to claim 19, wherein said dimension of said discharge space is within a range of 250 µm-1500 µm.

21. The method according to claim 1 wherein said AC voltage has a frequency with in a range of 1 kHz-1 MHz.

22. The method according to claim 21, wherein ihe frequency of said AC voltage is within a range of 20 kHz-500 kHz.

23. The method according to claim 1, wherein an amplitude of said AC voltage is within a range of 3 kV-6 kV.

24. The method according to claim 23, wherein said amplitude is within a range of 4500 V-5500V.

25. The method according to claim 13, wherein said gas present in said discharge space is a gas flow.

26. The method according to claim 25, a volumetric gas flux of said gas flow is within a range of 1 l/min and 50 l/min.

27. The method according to any of the claims 25 and 26, wherein said volumetric gas flux is in a range of 5 l/min and 15 l/min.

28. The method according to claim 1, wherein said surface is maximized.

29. An arrangement for generating an atmospheric pressure glow plasma (APG), comprising a discharge space substantially located between a plurality of electrodes for generating a plasma, wherein said electrodes are arranged for applying an AC voltage for establishing an electric field in said discharge space for generating said plasma, and wherein at least one of said electrodes comprises a dielectric attached such that a boundary surface between said dielectric and said discharge space is arranged for enabling interactions between said plasma and said surface and including at least one low work function region wherein the work function is smaller than the energy transferred to said surface during said interactions, wherein said dielectric is arranged for locally intensifying said electric field in said at least one low work function region for releasing electrons contributing to said plasma from said surface by said interactions.

30. The arrangement according to claim 29, wherein said dielectric comprises any substance of a group consisting of polyethyleneterephthalate (PET), polyethylenenaphthalate (PEN), polytetrafluoroethylene (PTFE), ceramic such as silica or alumina, and combinations thereof.

31. The arrangement according to any of the claims 29 and 30, comprising means for establishing a gas flow within said discharge space.

32. The arrangement according to claim 31, wherein said dielectric is movable relative to one of said electrodes.

33. The arrangement according to claim 32, comprising means arranged for treating a substrate film with said plasma.

34. The arrangement according to claim 33, wherein said boundary sutface between said dielectric and said discharge space is maximized.

35. The arrangement according to claim 29, wherein in operation energy is transferred to said surface during said interactions, and wherein said surface of said dielectric used comprises at least one low work function region having a work function smaller than said energy transferred to said surface during said interactions.

36. The method as in claim 2, wherein the work function is lower than 0.2 eV.

37. The method as in claim 2, wherein the low work function region comprises at least 10 ppm of the boundary surface.

38. The method as in claim 2, wherein the low work function region comprises at least 10 ppm of the boundary surface, and the work function is less than 0.2 eV.

39. The method as in claim 1, wherein the adapted dielectric results in a locally intensified electric field of at least 100 kV/cm.

40. The method according to claim 1 wherein said at least one physical property is adapted such that said electric field is locally intensified to values of at least 100 kV/cm.

41. The method according to claim 1, wherein the area of local intensification of the electic field and the at least one low work function region coincides with that portion of the dielectric which has been adapted.

42. The method as in claim 1, wherein the work function is lower than 0.2 eV.

43. The method as in claim 29, wherein the work function is lower than 0.2 eV.

44. The method as in claim 1, wherein the at least one low work function region comprises at least 10 ppm of the boundary surface and has a work function less than 0.2 eV.

45. The method as in claim 29, wherein the at least one low work function region comprises at least 10 ppm of the boundary surface and has a work function less than 0.2 eV.

46. The method according to claim 29, wherein energy is transferred to said surface during said interactions, and wherein said at least one low work function region has a work function less than 0.3 eV.

* * * * *